United States Patent
Takaya

(10) Patent No.: US 6,266,641 B1
(45) Date of Patent: *Jul. 24, 2001

(54) VOICE DATA PROCESSING CONTROL DEVICE AND RECORDING MEDIUM RECORDING A CONTROL PROGRAM FOR CONTROLLING VOICE DATA PROCESSING

(75) Inventor: Hiroshi Takaya, Hachioji (JP)

(73) Assignee: Olympus Optical Co., Ltd., Toyko (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,142

(22) Filed: Jun. 5, 1998

(30) Foreign Application Priority Data

Jun. 6, 1997 (JP) .................................................... 9-149728

(51) Int. Cl.[7] ................................................... G10L 21/06
(52) U.S. Cl. ............................................................ 704/276
(58) Field of Search .................................. 704/270, 276, 704/278

(56) References Cited

U.S. PATENT DOCUMENTS

| | | | |
|---|---|---|---|
| 5,146,371 | * 9/1992 | Hamada et al. | 360/32 |
| 5,225,947 | * 7/1993 | Wilson et al. | 360/72.1 |
| 5,359,472 | * 10/1994 | Motohashi | 360/72.2 |
| 5,524,140 | * 6/1996 | Klausner et al. | 379/67 |
| 5,566,379 | * 10/1996 | Mawatari et al. | 360/48 |
| 5,572,576 | * 11/1996 | Klausner et al. | 379/67 |
| 5,717,742 | * 2/1998 | Thomson | 379/88 |
| 5,845,240 | * 12/1998 | Fielder | 704/201 |
| 5,850,629 | * 12/1998 | Holm et al. | 704/260 |
| 5,875,448 | * 2/1999 | Boys et al. | 704/531 |
| 5,903,867 | * 5/1999 | Watari et al. | 704/270 |

FOREIGN PATENT DOCUMENTS

| | | |
|---|---|---|
| 0523452 A1 | 1/1993 | (EP) . |
| 0570147 A2 | 11/1993 | (EP) . |
| 0706114 A2 | 4/1996 | (EP) . |

* cited by examiner

Primary Examiner—Fan Tsang
Assistant Examiner—Michael N. Opsasnick
(74) Attorney, Agent, or Firm—Pillsbury Winthrop LLP

(57) ABSTRACT

A control program for controlling voice data processing by a computer causes the computer to selectively display a list display screen for displaying a list of file information concerning voice data of each file, and an operating screen, excluding the list of file information, for displaying an operating portion for performing voice data playback processing. The control program causes the computer to play back voice data of a file subsequent to a currently played-back file according to an order in the list displayed on the first screen, if a predetermined operation is executed on the second screen while the second screen is displayed.

17 Claims, 4 Drawing Sheets

VOICE DATA PROCESSING CONTROL DEVICE AND RECORDING MEDIUM RECORDING A CONTROL PROGRAM FOR CONTROLLING VOICE DATA PROCESSING

BACKGROUND OF THE INVENTION

1. Field of the Invention

This invention relates to a control device for controlling voice data processing, and a recording medium recording a control program for controlling voice data processing, and more particularly, to a voice data processing control device for controlling voice data processing by a programmed computer, and a recording medium recording a control program for controlling voice data processing by a computer.

2. Description of the Related Art

Conventionally, an information playback device, a so-called transcriber, has generally been put to practical use. The device is used by an operator, such as a typist, to compose a document with a document composing device, such as a typewriter and a word processor, while playing back a voice of a dictated speech or the like which has been converted into an electric signal and recorded by a voice data recording device or the like.

When using such an information playback device, an operation timing, such as of starting a playback of voice data, and of stopping, fast forwarding, fast rewinding or the like, is generally decided by the operator directly operating a mode setting member or the like of the playback device, or operating a remote control switch, such as a foot switch.

Namely, the operator operates the information playback device to compose a document from voice data while manually and arbitrarily adjusting, for example, a playback time from a start to an end of the playback of the voice data, according to his or her skill in operation.

On the other hand, in recent years, a compact and low-priced computer for personal use, a so-called personal computer (hereinafter simply called "computer") is widely used. As the processing ability of this kind of computer increases, its use environment is being improved. For example, it is possible to perform processing operations, such as document composing and playing back recorded voice data.

Therefore, the conventional operation for composing a document from recorded voice data by using the information playback device or the like can now be made by using one computer.

In this case, it is performed in one computer by using a plurality of application software for document composing and voice data processing.

The operations made by the operator at this time are as follows: by using the software for voice data processing, a desired voice data file is selected from a plurality of voice data files recorded by the voice data recording device or the like to a recording medium in the form of electric signal data which can be processed by a computer. After the selected voice data file is processed by a voice data processing device, the voice data file is played back by a voice output device, while characters are inputted by using the software for document composing, which is opened on the same screen of the same computer.

In this case, in a working area on the screen of the software for voice data processing, there will be displayed, for example, a list of file information which is the information concerning a plurality of voice data recorded in respective files, and an operating portion for actuating voice data playback processing.

Further, it is required to reserve the working area on the screen of the software for document composing as wide as possible.

Therefore, in order to execute a voice data playback operation and a document composing operation at the same time within a limited area of the screen, a means is conceived for reserving the working area on the screen for the document composing operation as wide as possible, in such a manner that a small screen exclusive to the playback operation is prepared for displaying only the operating portion for the voice data playback operation and is called up at the time of playback after a desired file is selected on the list screen displaying a plurality of recorded voice data files.

However, conventionally, a complicated procedure is followed. Namely, after the selected desired voice data file is played back, the file list display screen is called up again in order to select a voice data file to be played back next. After the next desired data file is selected, the display exclusive to the playback operation is called up to return to the document composing operation. Therefore, the efficiency of operation falls and the operator feels it inconvenient and is dissatisfied.

SUMMARY OF THE INVENTION

An object of this invention is to provide a device for controlling voice data processing, and a recording medium recording a control program for controlling voice data processing, which make it possible to achieve a better feeling of use and to effectively execute other operations, such as a document composing operation and the like, simultaneously with a playback operation of voice data, when the voice data processing is controlled by a voice data processing device, such as a computer.

In order to attain the foregoing object, a voice data processing control device according to this invention is a device for controlling voice data processing by a programmed computer, which comprises a selective display means for selectively displaying a first screen for displaying a list of file information concerning voice data of each file, and a second screen, excluding the list of file information, for displaying an operating portion for performing voice data playback processing; and a playback shifting means for playing back voice data of a file subsequent to a currently played-back file according to an order in the list displayed on the first screen, if a predetermined operation is executed on the second screen while the second screen is displayed.

A recording medium recording a control program for controlling voice data processing according to this invention is a recording medium recording a control program for controlling voice data processing by a computer, in which the control program causes the computer to selectively display a first screen for displaying a list of file information concerning voice data of each file, and a second screen, excluding the list of file information, for displaying an operating portion for performing voice data playback processing, and in which the control program causes the computer to play back voice data of a file subsequent to a currently played-back file according to an order in the list displayed on the first screen, if a predetermined operation is executed on the second screen while the second screen is displayed.

DETAILED DESCRIPTION OF THE PREFERRED EMBODIMENT

Based on the drawings, an embodiment of this invention will now be described.

Figure 1:
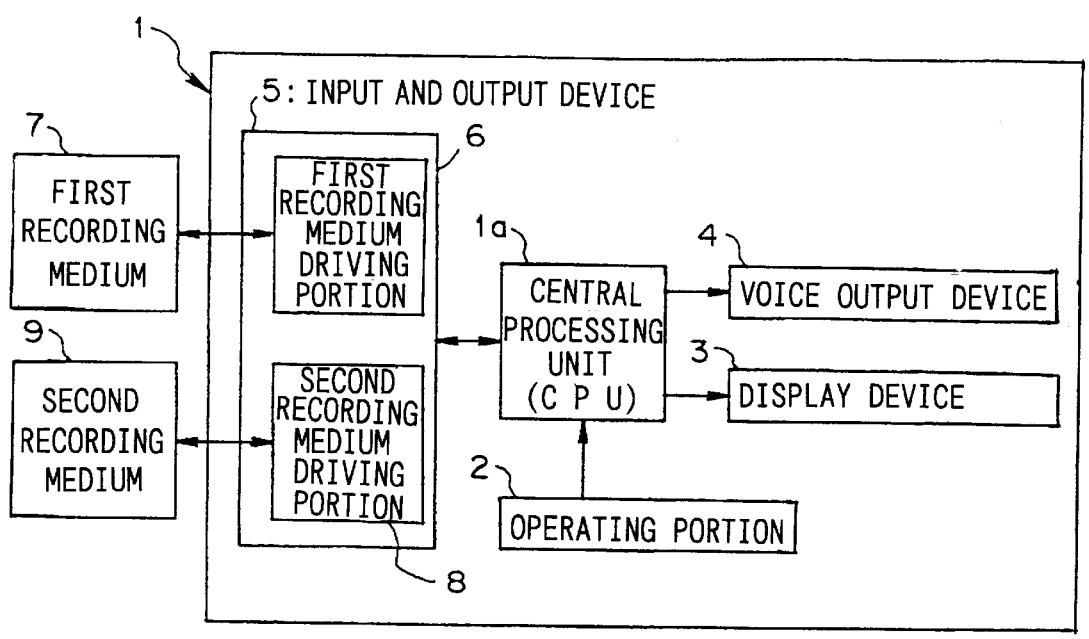
FIG. 1 is a block diagram of a voice data processing control device of an embodiment of this invention.

FIG. 1 is a block diagram of a voice data processing control device of an embodiment of this invention. A voice data processing control device 1 of this embodiment comprises a central processing unit 1a such as a CPU, an operating portion 2, a display device 3, a voice output device 4, an input and output device 5 and the like. The central processing unit 1a is a means for executing a computation and the like in order to process voice data and to control the processing. The operating portion 2 comprises a keyboard, a pointing device such as a mouse, and the like, for making a predetermined instruction when voice data processing and the like are executed by the central processing unit 1a. The display device 3 is a CRT display (cathode-ray tube display), a liquid crystal display or the like for displaying on a screen an operating portion for voice data playback processing and the like executed by the central processing unit 1a, and a list of recorded voice data and the like. The voice output device 4 is a speaker or the like for outputting as a voice a result of the voice data processing and the like achieved by the central processing unit 1a. The input and output device 5 is to be removably loaded with a first recording medium 7 recording a control program for controlling voice data processing and a second recording medium 9 recording voice data, and inputs to and outputs from the central processing unit 1a information, data and the like.

The input and output device 5 comprises a first recording medium driving portion 6, a second recording medium driving portion 8 and the like. The first recording medium driving portion 6 is to be loaded with the first recording medium 7, such as a floppy disk, a CD-ROM or the like, recording a processing program for processing voice data and a control program for controlling the processing, and reads in the control program recorded to the first recording medium. The second recording medium driving portion 8 is to be loaded with the second recording medium 9, such as a PC card, a memory card, a miniature IC card or the like, recording voice data and the like, reads in the voice data and the like recorded to the second recording medium 9, and records the voice data and the like processed by the central processing unit 1a.

The first recording medium 7 is not limited to the above-mentioned floppy disk, a CD-ROM or the like. For example, a random-access memory or the like capable of arbitrarily rewriting information and data can be used.

Figure 2:
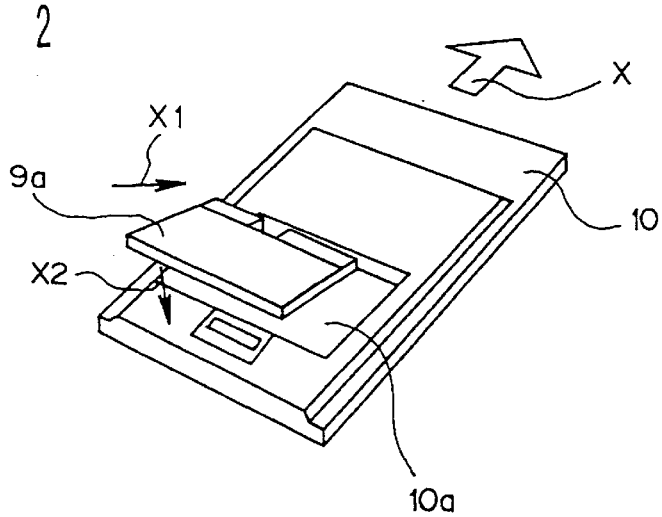
FIG. 2 is a perspective view of a PC card adapter used for the voice data processing control device of FIG. 1.

Further, if the second recording medium driving portion 8 is, for example, a PC card driving device which is to be loaded with a PC card as the second recording medium 9 and reads in the voice data and the like recorded to the medium 9, a miniature IC card 9a or the like can also be utilized by preparing a PC card adapter 10 such as shown in FIG. 2, instead of using a general PC card as the second recording medium 9.

Namely, the PC card adapter 10 is formed to have the same shape and size as those of a general PC card. One surface of the PC card adapter 10 is provided with a loading portion 10a which is a recess portion having substantially the same shape as that of the miniature IC card 9a and into which the miniature IC card 9a is loaded.

The miniature IC card 9a is loaded in the loading portion 10a by directing a front end face of the miniature IC card 9a in a direction of arrow X1 of FIG. 2 to make it abut on one side of an inner wall surface of the loading portion 10a, and then pushing a rear end face of the card 9a in a direction of arrow X2. In this loaded state, the miniature IC card 9a and the IC card adapter 10 are electrically connected.

When the IC card adapter 10, in which the miniature IC card has been loaded as described above, is inserted and loaded in an insertion slot (not shown) of the PC card driving device, which is the second recording medium driving portion 8, from a direction of arrow X, then processing operations, such as reading in voice data recorded to the miniature IC card 9a, can be executed in the same way as in the case of a general PC card.

Next, referring to FIGS. 3 and 4, there will be described operation screens of the control program for controlling voice data processing by the voice data processing control device according to this embodiment, that is, the control program to be executed by a programmed computer.

Figure 3:
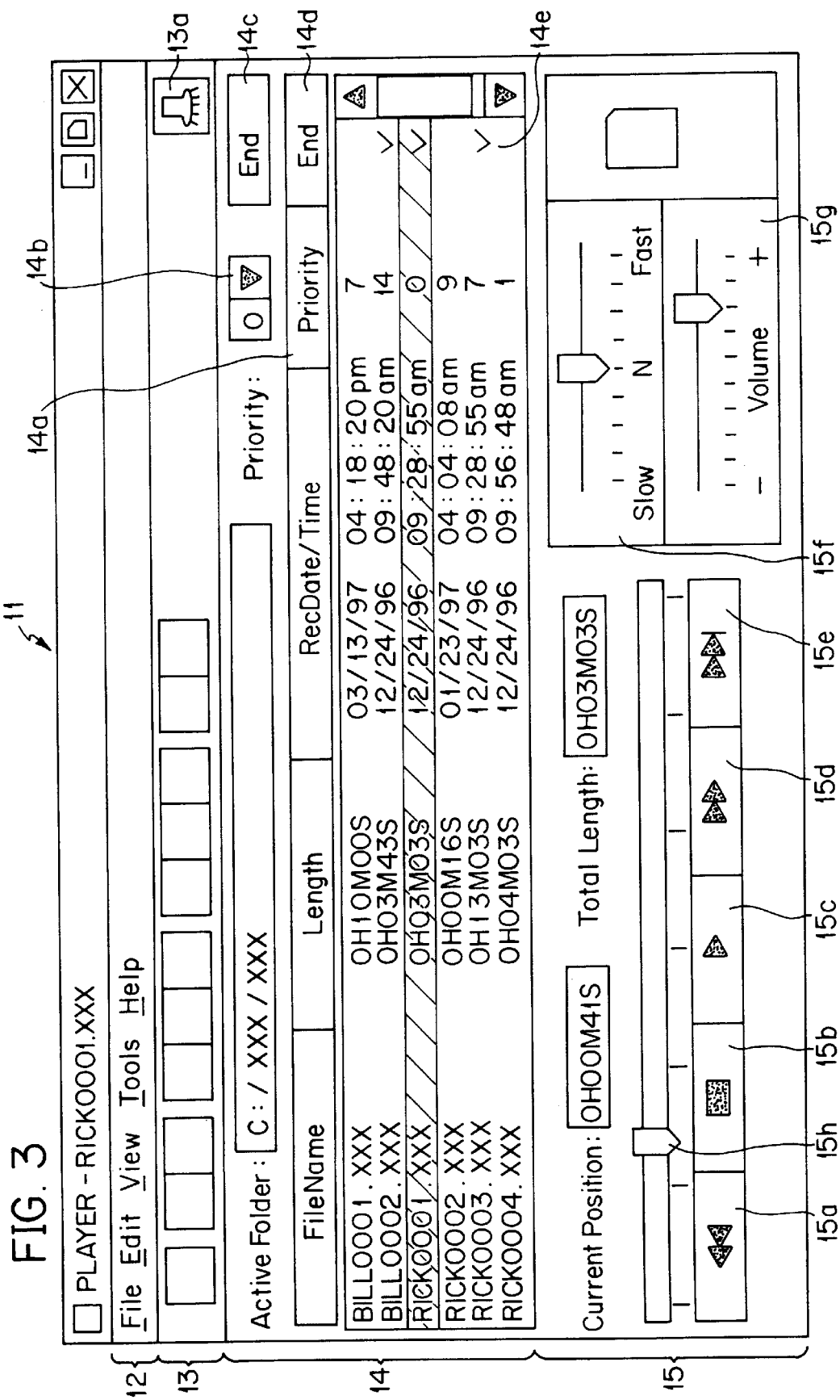
FIG. 3 is an illustration of a first screen which is an operation screen in a control program of the voice data processing control device of FIG. 1 for displaying a list of file information.
Figure 4:
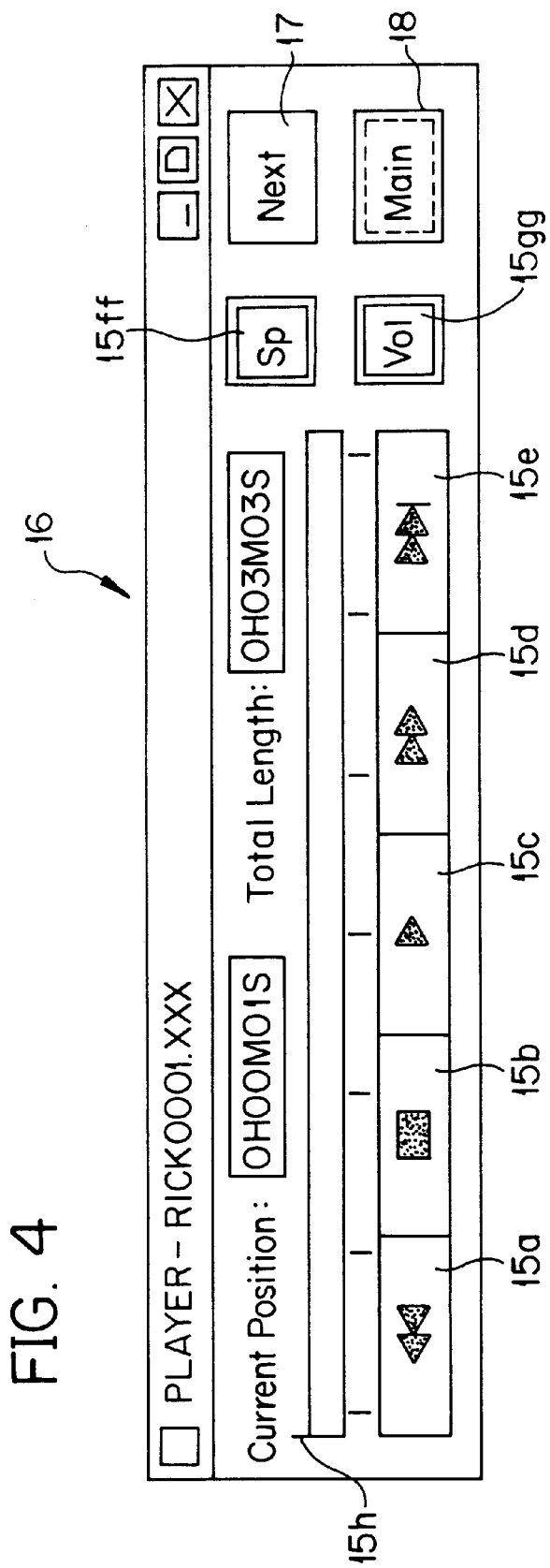
FIG. 4 is an illustration of a second screen which is an operation screen in a control program of the voice data processing control device of FIG. 1 for displaying an operating portion for performing voice data playback processing.

The control program in this embodiment selectively displays a first screen 11 (see FIG. 3) and a second screen 16 (see FIG. 4). The first screen 11 displays a list of file information which is detailed information of the voice data of each file. The second screen 16 is a screen exclusive to the playback operation, excluding the list of file information, for displaying an operating portion for performing voice data playback processing.

The first screen 11 is formed of a plurality of operating portions, as shown in FIG. 3, for designating various functions to instruct a computer to execute various commands. The first screen 11 comprises, for example, a menu bar 12, a tool bar 13, a voice file list box 14, and a playback control portion 15. The menu bar 12 is an area displaying by characters and the like a list of various selectable processing commands. The tool bar 13 is an area which is arranged immediately under the menu bar 12 and displays, in a row, buttons with icons representing functions of various processing commands by designs, pictorial symbols and the like so that the functions frequently used can be quickly started. The voice file list box 14 displays a list of file information. The playback control portion 15 has buttons and the like arranged in a row for various operations concerning the playback operation.

As described above, taking their operability into consideration, for example, the buttons with icons represented by designs, pictorial symbols and the like are used as the various command buttons shown in the tool bar 13. For example, the tool bar 13 is provided with a screen switching button 13a which is a selective display means for displaying the second screen 16. Because other buttons are not directly related to this invention, their detailed description is omitted, and in FIG. 3, in order to avoid complexity, only the buttons are shown without illustrating icons and the like.

The voice file list box 14 displays a list of voice data files, which are recorded by a voice data recording device (not shown) or the like and can be played back. The list displays various information on each voice data file, such as a file name, a length of recording time, a recording date/time, a degree of importance, and an end mark, which are specific to each file.

The display portion of the above items has a sorting means which comprises buttons for a sorting operation, such as a File Name button, a Length button, a Rec Date/Time button, a Priority button, an End button and the like. By arbitrarily selecting and designating each button, the file information can be sorted according to a predetermined order in the selected item.

For example, in the list display of the voice file list box 14, the importance-degree information of the voice file can be arbitrarily preset for each file information. The importance-degree information is set by a priority ranking button 14b after file information desired to be set is selected to display brightly the field of the desired file information in the list display (highlighted display or inverted display. In FIG. 3, exemplified by a hatched field). An index of the order of priority (importance) is shown, for example, by digits of 1 to 14.

By pushing (clicking) a Priority button 14a which is a sorting means, the list display of the file information is sorted in order of the preset degrees of importance.

Further, in the column of the End mark in the list display of the voice file list box 14, a predetermined mark 14e, such as a "V" mark, an "X" mark and the like, can be added.

In order to add the predetermined mark 14e as file information, a predetermined file information is selected in the same manner as in the procedure described above, the field of the desired file information in the list display is displayed brightly, and a predetermined mark adding button 14c which is a mark adding means is operated. The predetermined mark adding button 14c is of a so-called toggle switch type. When the predetermined mark adding button 14c is operated, the predetermined mark 14e can be added and the added mark 14e can be deleted, alternatively.

By clicking the End button 14d which is a sorting means, the field of the file information provided with the predetermined mark 14e is moved to the lowermost (last) position in the list display, so that the file information is sorted.

Further, the predetermined mark 14e serves as an identification sign for a function of skipping the voice data file provided with the predetermined mark 14e, when the playback operation is performed by the playback control portion 15. (Details are described below.)

The playback control portion 15 is provided with buttons for executing various operations regarding the playback operation: for example, a returning button 15a, a stop button 15b, a playback button 15c, a fast forward button 15d, a skip button 15e, a playback speed control portion 15f, and a volume control portion 15g and the like. The returning button 15a is for returning to an arbitrary data position before the current position in a selected predetermined voice data file. The stop button 15b stops a playback operation. The playback button 15c starts a playback operation. The fast forward button 15d is for advancing to an arbitrary data position after the current position. The skip button 15e operates a skip means for skipping a voice data file provided with a predetermined mark 14e, and a playback shifting means. The playback speed control portion 15f comprises a slide bar for adjusting a playback speed. The volume control portion 15g adjusts volume.

The current position in the selected data file is indicated for example, by hours, minutes, and seconds (HH:MM:SS). At the same time, an indicator 15h comprising a slide bar indicates the current position.

Further, the information on the total length of recording time of the selected data file is also indicated by hours, minutes, and seconds (HH:MM:SS).

On the other hand, as described above, the second screen 16 is a screen for displaying an operation portion for the voice data playback processing, where only the portion excluding the list display portion is displayed.

As shown in FIG. 4, the second screen 16 displays the various kinds of buttons 15a, 15b, 15c, 15d, and 15e, and the current position and the total length of recording time, which are displayed in the playback control portion 15 of FIG. 3. The playback speed control portion 15f and the volume control portion 15g, where indications are made by slide bars in the first screen 11, are displayed on the second screen 16 by buttons with icons 15ff and 15gg, respectively (the icons are omitted in FIG. 4). By selectively designating the buttons 15ff and 15gg, there will show up respective display portions independently which are approximately the same as the corresponding slide bar displays on the first screen 11.

Further, the second screen 16 displays a Next button 17 for directly shifting from the current data file to the beginning of the next data file, and a Main button 18 which is a selective display means for returning to the first screen 11.

In order to perform the various operations via the operation portion 2 when the first screen 11 and the second screen 16 are displayed, desired items are selected by inputting the numbers, characters and the like assigned to the respective items via the keyboard or the like, or by selecting the various buttons and the like by using the mouse or the like.

Next, referring to a flowchart of FIG. 5, there will be described a flow of operation when a playback operation is executed by the control program, skipping voice data of a file provided with the predetermined mark 14e.

Figure 5:
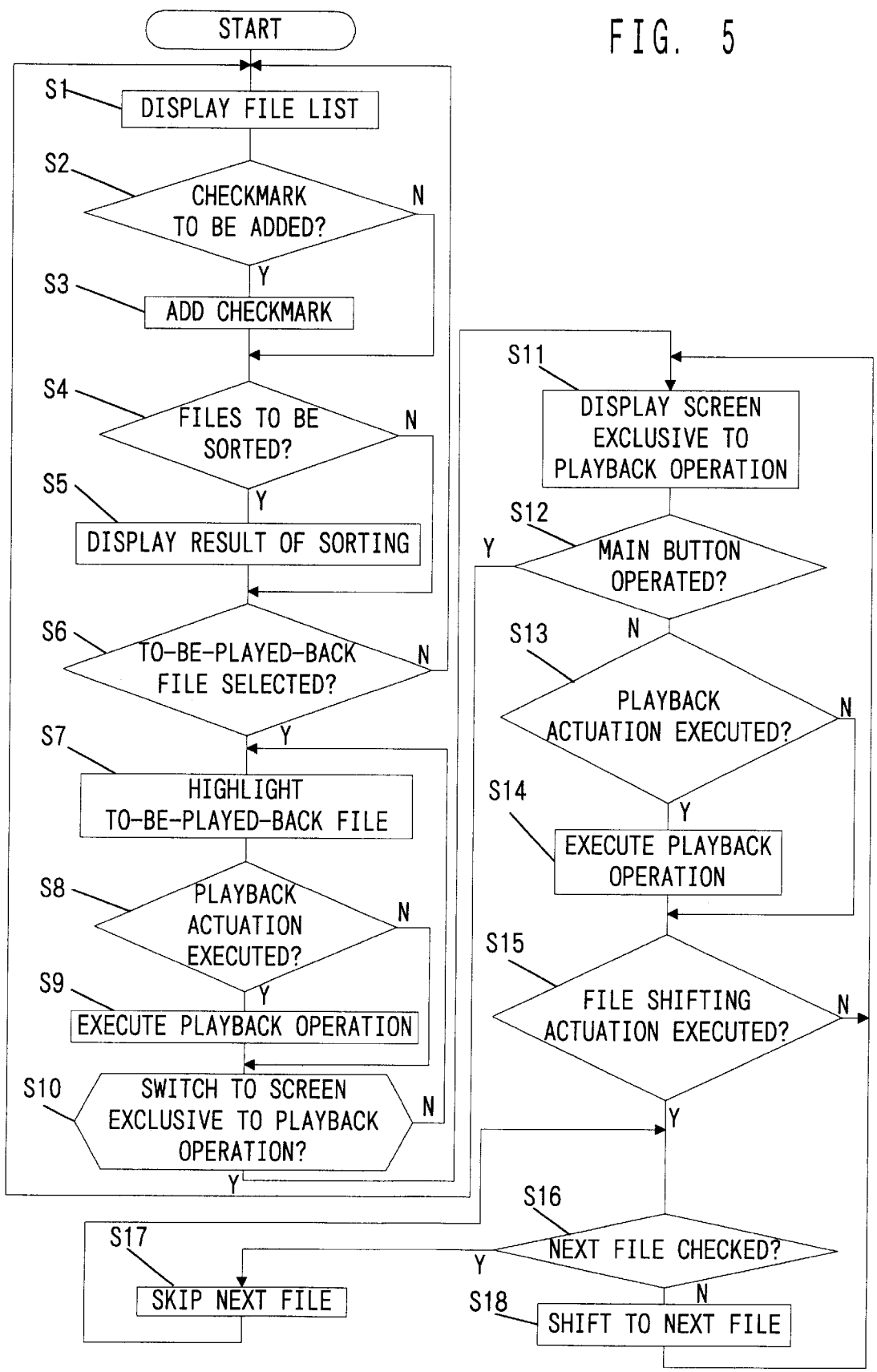
FIG. 5 is a flowchart of a control program of the voice data processing control device of FIG. 1 which shows a flow of operations when a playback operation is executed by skipping voice data of a file to which a predetermined mark is added.

Prior to executing the operation of the flowchart of FIG. 5, the central processing unit 1a of the voice data processing control device 1 reads in the control program for the voice data processing from the first recording medium 7 via the first recording medium driving portion 6 to a random-access memory or the like in the processing control device 1. The central processing unit 1a also reads in (downloads) the voice data or the like recorded to the second recording medium 9, via the second recording medium driving portion 8 to a fixed recording medium (not shown) in the processing control device 1.

If the predetermined mark 14e is added in advance by an optional setting to the file information of the voice data to be played back, a predetermined mode setting is designated in order to execute a playback operation by skipping that file.

When the control program is started (START) after the processing control device 1 has been set in this way, the display device 3 displays the first screen 11 where the list of voice data files is displayed (step S1).

In step S2, if the predetermined mark 14e is to be added to desired file information in order to execute a playback operation by skipping the voice data of the predetermined file, the process proceeds to step S3. In step S3, the desired file information to which the predetermined mark 14e is to be added is selected from the list display, then the predetermined mark 14e is added to the file information by the predetermined mark adding button 14c, and the process proceeds to step S4.

If the predetermined mark 14e is not to be added anew in step S2, the process proceeds to step S4.

Next, in step S4, if the voice data file information in the list display of the first screen 11 is to be sorted, one of the buttons with the respective item names indicated in the list display in the voice file list box 14 is selected and designated, that is, the File Name button, the Length button, the Rec Date/Time button, the Priority button, and the End button. According to the selected and designated item, the voice data files are sorted. In step 5, the first screen 11 displays a list resulting from the file sorting, and the process proceeds to step S6.

If the file information is not to be sorted in step S4, the process proceeds to step S6.

In step S6, the operator selects from the list display of the first screen 11, a voice data file which is desired to be played back. Instep S7, the selected voice data file is brightly displayed (highlighted) in the list display.

Next, in step S8, it is checked whether a playback actuation has been executed, namely, whether the playback button 15c for executing various operations concerning a playback operation has been clicked. If the playback actuation has been executed, the process proceeds to step S9. In step S9, the playback operation is executed and the process proceeds to step S10.

If the playback actuation has not been executed in step S8, the process proceeds to step S10.

In step S10, it is checked whether the display is to be switched to the second screen 16. If the display is not to be switched to the second screen 16, the process returns to step S7 and the following steps are repeated.

If the display is switched to the second screen 16 in step S10, the second screen 16 (screen exclusive to the playback operation) is displayed on the display device 3 in step S11.

Next, in step S12, it is checked whether the Main button 18 in the second screen 16 has been operated. If the Main button 18 has been operated, the process returns to step S1, in which the first screen 11 for displaying the file list is displayed, and the following steps are repeated.

If the Main button 18 has not been operated in step S12, it is checked in the next step S13 whether a playback actuation has been executed. If the playback actuation has been executed, a playback operation is executed in the next step S14, and the process proceeds to the next step S15.

If the playback actuation has not been executed in step S13, the process proceeds to step S15.

In step S15, it is checked whether a file shifting actuation has been executed, namely, whether the Next button 17 has been clicked.

If it is decided in step S15 that the Next button 17 has not been clicked, the process returns to step S11 and the following steps are repeated.

If, during the play back of voice data or after the playback operation of the currently selected voice data file has been finished, the operator clicks the Next button 17 in order to playback the next voice data file, then the information of the next voice data file is verified in step S16. If the predetermined mark 14e has been added to the file information, the file provided with the predetermined mark 14e is skipped in step S17, and the process of step S16 is repeated.

If a file without the predetermined mark 14e is detected in step S16, the process proceeds to step S18, in which the shift to the file without the predetermined mark 14e detected in step S16 is made and the voice data of the file is read in. The process returns to step S11 and the following steps are repeated.

Thus, the control program instructs the following operations to be executed. If predetermined operations are executed on the screen, namely, if desired file information is selected and the predetermined mark adding button 14c is operated while the first screen 11 is displayed, then the predetermined mark 14e is added to the selected file information in the list display on the first screen 11. Further, if a predetermined operation is executed on the screen, namely, if the skip button 15e is operated while the second screen 16 is displayed, then the voice data of a file provided with the predetermined mark 14e is skipped when playing back the voice data of a file subsequent to the currently played-back file according to the order in the list display on the first screen 11.

As described above, according to the embodiment, after the desired voice data file to be played back is selected in the voice file list box 14 on the first screen 11, the playback operation is executed by switching over from the first screen 11 to the second screen 16 (screen exclusive to the playback operation) which is smaller than the first screen. Therefore, the working area on the screen for other control programs, such as the software for document composing and the like, can be reserved as wide as possible, and at the same time, the playback of the voice data file can be operated.

Further, after the operation of playing back the currently selected predetermined voice data file has been executed, the shift to the next voice data file can be made according to the preset file order without returning to the first screen 11. Therefore, a plurality of voice data files can easily be played back continuously.

Moreover, the files can be sorted with respect to the respective items of the file information, and by adding the predetermined mark 14e as file information, a playback operation is executed, skipping a file under a specified condition.

What is claimed is:

1. A voice data processing control device for controlling voice data processing with a programmed computer, comprising:

selective display means for selectively displaying one of
   a first screen including (A) an operating portion that controls voice data playback processing and (B) a list of file information relating to voice data of a plurality of files, and
   a second screen excluding the list of file information and including the operating portion that controls voice data playback processing, the second screen being smaller than the first screen; and playback shifting means for playing back voice data of a file subsequent to a currently played-back file according to an order in the list displayed on the first screen, when a predetermined operation is executed by executing the operating portion on the second screen while the second screen is displayed, wherein the first screen further includes a first switching portion for causing the selective display means to display the second screen instead of the first screen, and wherein the second screen further includes a second switching portion for causing the selective display means to display the first screen instead of the second screen.

2. The device according to claim 1, further comprising:

sorting means for sorting in a predetermined order the file information displayed in the list, if a predetermined operation is executed on the first screen while the first screen is displayed.

3. The device according to claim 1, further comprising:
mark adding means for adding a predetermined mark to file information in the list displayed on the first screen, if a predetermined operation is executed on the first screen while the first screen is displayed; and
skip means for skipping voice data of a file whose file information is provided with the predetermined mark, when playing back the voice data of the file subsequent to the currently played-back file according to the order in the list displayed on the first screen, if a predetermined operation is executed on the screen while the second screen is displayed.

4. The device according to claim 2, further comprising:
mark adding means for adding a predetermined mark to file information in the list displayed on the first screen, if a predetermined operation is executed on the first screen while the first screen is displayed; and
skip means for skipping voice data of a file whose file information is provided with the predetermined mark, when playing back the voice data of the file subsequent to the currently played-back file according to the order in the list displayed on the first screen, if a predetermined operation is executed on the screen while the second screen is displayed.

5. A recording medium recording a control program for controlling voice data processing with a computer, in which the control program causes the computer to selectively display one of a first screen including (A) an operating portion that controls voice data playback processing and (B) a list of file information relating to voice data of a plurality of files, and a second screen excluding the list of file information and including the operating portion that controls voice data playback processing, the second screen being smaller than the first screen, the first screen further including a first switching portion for causing the computer to display the second screen instead of the first screen, and the second screen further including a second switching portion for causing the computer to display the first screen instead of the second screen, and in which the control program causes the computer to play back data of a file subsequent to a currently played-back file according to an order in the list displayed on the first screen, when a predetermined operation is executed by operating the operating portion on the second screen while the second screen is displayed.

6. The recording medium according to claim 5, in which the control program sorts in a predetermined order the file information displayed in the list, if a predetermined operation is executed on the first screen while the first screen is displayed.

7. The recording medium according to claim 5, in which the control program causes a predetermined mark to be added to file information in the list displayed on the first screen, if a predetermined operation is executed on the first screen while the first screen is displayed, and causes voice data of a file whose file information is provided with the predetermined mark to be skipped when playing back the voice data of the file subsequent to the currently played-back file according to the order in the list displayed on the first screen, if a predetermined operation is executed on the screen while the second screen is displayed.

8. The recording medium according to claim 6 in which the control program causes a predetermined mark to be added to file information in the list displayed on the first screen, if a predetermined operation is executed on the first screen while the first screen is displayed, and causes voice data of a file whose file information is provided with the predetermined mark to be skipped when playing back the voice data of the file subsequent to the currently played-back file according to the order in the list displayed on the first screen, if a predetermined operation is executed on the screen while the second screen is displayed.

9. A voice data processing control device for controlling voice data processing with a programmed computer, comprising:
a display for selectively displaying one of a first screen including (A) an operating portion that controls voice data playback processing and (B) a list of file information relating to voice data of a plurality of files, and a second screen excluding the list of file information and including the operating portion that controls voice data playback processing, the second screen being smaller than the first screen, the first screen further including a first switching portion for causing the display to display the second screen instead of the first screen, and the second screen further including a second switching portion for causing the display to display the first screen instead of the second screen; and
a playback device for playing back voice data of a file subsequent to a currently played-back file according to an order in the list displayed on the first screen, when a predetermined operation is executed by operating the operating portion on the second screen while the second screen is displayed.

10. A voice data processing control device comprising:
selective display means configured and arranged to display one among
a first screen, said first screen including
a list having a plurality of file entries, each file entry corresponding to one among a plurality of files having recorded voice data, and
a playback control portion, said playback control portion having controls for selectable execution of playback operations upon a current one of the plurality of files having recorded voice data, and
a second screen, said second screen including the playback control portion and excluding the list; and
playback shifting means configured and arranged to shift a playing back of voice data from the current one of the plurality of files having recorded voice data to a subsequent one of the plurality of files having recorded voice data according to an order of the file entries in the list,
wherein said second screen further includes a shifting control portion for selectable actuation of said playback shifting means, and
wherein the second screen is smaller than the first screen, and
wherein the first screen further includes a first switching portion for causing said selective display means to display the second screen instead of the first screen, and
wherein the second screen further includes a second switching portion for causing said selective display means to display the first screen instead of the second screen.

11. The voice data processing control device according to claim 10, said device further comprising:
a sorting means configured and arranged to sort in a predetermined order the plurality of file entries,
wherein said first screen further includes a sorting control portion for selectable actuation of said sorting means.

12. The voice data processing control device according to claim 11, said device further comprising:

mark adding means for adding a predetermined mark to at least one among said plurality of file entries; and skip means configured and arranged to skip a file during a playing back of voice data, wherein said skipped file corresponds to a file entry having the predetermined mark, wherein said first screen further includes a mark control portion for selectable actuation of said mark adding means, and wherein said second screen further includes a skip control portion for selectable actuation of said skip means.

13. The voice data processing control device according to claim 10, said device further comprising:

mark adding means for adding a predetermined mark to at least one among said plurality of file entries; and skip means configured and arranged to skip a file during a playing back of voice data, wherein said skipped file corresponds to a file entry having the predetermined mark, wherein said first screen further includes a mark control portion for selectable actuation of said mark adding means, and wherein said second screen further includes a skip control portion for selectable actuation of said skip means.

14. A voice data processing control device comprising:

selective display means configured and arranged to display one among a first screen, said first screen including
a list having a plurality of file entries, each file entry corresponding to one among a plurality of files having recorded voice data, and
a playback control portion, said playback control portion having controls for selectable execution of playback operations upon a current one of the plurality of files having recorded voice data, and a second screen, said second screen including the playback control portion and excluding the list; and playback shifting means configured and arranged to shift a playing back of voice data from the current one of the plurality of files having recorded voice data to a subsequent one of the plurality of files having recorded voice data according to an order of the file entries in the list, wherein said second screen further includes a shifting control portion for selectable actuation of said playback shifting means, and wherein the second screen is smaller than the first screen.

15. The voice data processing control device according to claim 14, said device further comprising:

a sorting means configured and arranged to sort in a predetermined order the plurality of file entries, wherein said first screen further includes a sorting control portion for selectable actuation of said sorting means.

16. The voice data processing control device according to claim 15, said device further comprising:

mark adding means for adding a predetermined mark to at least one among said plurality of file entries; and skip means configured and arranged to skip a file during a playing back of voice data, wherein said skipped file corresponds to a file entry having the predetermined mark, wherein said first screen further includes a mark control portion for selectable actuation of said mark adding means, and wherein said second screen further includes a skip control portion for selectable actuation of said skip means.

17. The voice data processing control device according to claim 14, said device further comprising:

mark adding means for adding a predetermined mark to at least one among said plurality of file entries; and skip means configured and arranged to skip a file during a playing back of voice data, wherein said skipped file corresponds to a file entry having the predetermined mark, wherein said first screen further includes a mark control portion for selectable actuation of said mark adding means, and wherein said second screen further includes a skip control portion for selectable actuation of said skip means.

* * * * *